US009236282B2

(12) United States Patent
Jost et al.

(10) Patent No.: US 9,236,282 B2
(45) Date of Patent: Jan. 12, 2016

(54) ARRANGEMENT, SYSTEM, AND METHOD FOR PROCESSING MULTILAYER BODIES

(75) Inventors: Stefan Jost, Munich (DE); Joerg Palm, Munich (DE); Martin Fuerfanger, Steinhoering (DE)

(73) Assignee: Saint-Gobain Glass France, Courbevoie (FR)

( * ) Notice: Subject to any disclaimer, the term of this patent is extended or adjusted under 35 U.S.C. 154(b) by 463 days.

(21) Appl. No.: 13/580,383

(22) PCT Filed: Feb. 22, 2011

(86) PCT No.: PCT/EP2011/052581
§ 371 (c)(1),
(2), (4) Date: Oct. 19, 2012

(87) PCT Pub. No.: WO2011/104222
PCT Pub. Date: Sep. 1, 2011

(65) Prior Publication Data
US 2013/0029479 A1    Jan. 31, 2013

(30) Foreign Application Priority Data

Feb. 23, 2010    (EP) .................................... 10154370

(51) Int. Cl.
*H01L 21/00*    (2006.01)
*H01L 21/673*    (2006.01)
(Continued)

(52) U.S. Cl.
CPC ...... *H01L 21/67346* (2013.01); *C23C 16/4583* (2013.01); *H01L 21/67109* (2013.01);
(Continued)

(58) Field of Classification Search
CPC ............ H01L 21/673; H01L 21/67739; H01L 21/67346

USPC .............................................. 438/479, 93, 95
See application file for complete search history.

(56) References Cited

U.S. PATENT DOCUMENTS

| 4,593,664 | A  | 6/1986 | Omori et al. |
| 6,273,275 | B1 | 8/2001 | Kim et al. |

(Continued)

FOREIGN PATENT DOCUMENTS

| EP | 1 833 097 | 9/2007 |
| GB | 2 331 509 | 5/1999 |

(Continued)

OTHER PUBLICATIONS

English Machine translation of JP2008/124091.*

(Continued)

*Primary Examiner* — Bradley K Smith
(74) *Attorney, Agent, or Firm* — Oblon, McClelland, Maier & Neustadt, L.L.P.

(57) ABSTRACT

The invention relates to a multilayer body arrangement, which comprises at least two multilayer bodies each having at least one surface to be processed as well as at least one device for positioning the multilayer bodies, wherein the device is configured such that the respective surfaces to be processed are opposite each other and thus form a quasi-closed processing space disposed between the surfaces, in which the processing occurs. It further relates to a system for processing multilayer bodies with such a multilayer body arrangement, as well as a method for processing multilayer bodies, wherein the multilayer bodies are disposed such that the respective surfaces to be processed are opposite each other and thus form a quasi-closed processing space disposed between the surfaces, in which the processing occurs.

21 Claims, 7 Drawing Sheets

Figure 1:
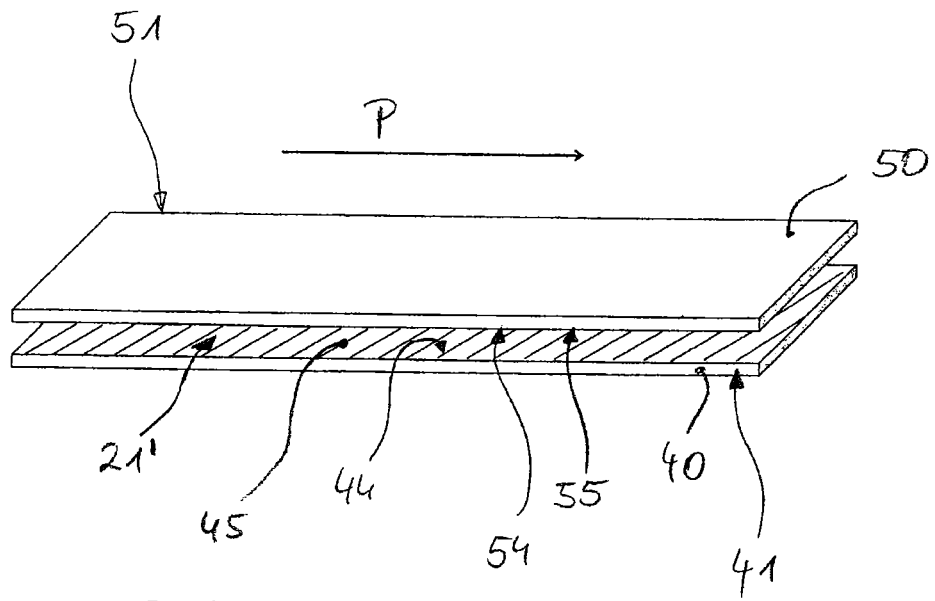

(51) Int. Cl.
    *C23C 16/458* (2006.01)
    *H01L 21/67* (2006.01)
    *H01L 31/032* (2006.01)
    *H01L 31/18* (2006.01)

(52) U.S. Cl.
    CPC .... *H01L21/67353* (2013.01); *H01L 21/67383* (2013.01); *H01L 31/0322* (2013.01); *H01L 31/1876* (2013.01); *Y02E 10/541* (2013.01)

(56) References Cited

U.S. PATENT DOCUMENTS

2002/0076882 A1  6/2002  Iwane et al.
2006/0105498 A1  5/2006  Huang et al.
2008/0110495 A1  5/2008  Onodera et al.

FOREIGN PATENT DOCUMENTS

| | | |
|---|---|---|
| JP | 60 21897 | 2/1985 |
| JP | 2008 124091 | 5/2008 |
| WO | 2004 025716 | 3/2004 |
| WO | 2004 032593 | 4/2004 |

OTHER PUBLICATIONS

International Preliminary Report on Patentability and Written Opinion issued Aug. 28, 2012 in PCT/EP2011/052581 (English translations only).
U.S. Appl. No. 13/580,322, filed Aug. 21, 2012, Palm, et al.
U.S. Appl. No. 13/580,241, filed Aug. 21, 2012, Palm, et al.
International Search Report Issued Apr. 28, 2011 in PCT/EP11/052581 Filed Feb. 22, 2011.
U.S. Appl. No. 14/487,805, filed Sep. 16, 2014, Palm, et al.

* cited by examiner

ARRANGEMENT, SYSTEM, AND METHOD FOR PROCESSING MULTILAYER BODIES

The invention relates to an arrangement, a system, and a method for processing, in particular, selenizing, multilayer bodies.

In the following, the processing of multilayer bodies is described, e.g., of substrates (e.g., glass substrates). Even when the specific term "substrate" is used, the statements always refer in general to "multilayer bodies". A "naked", uncoated substrate can be referred to as a substrate as can be a coated substrate, i.e., a multilayer body. A multilayer body is formed, for example, by application of a functional layer on a carrier layer. In order for the layers or at least the functional layer to have the desired physical and/or chemical properties, the multilayer body or, optionally, the layers, must be subjected to processing. The processing can, for example, be provided as tempering or annealing in the presence of a process gas. For this, systems in which a multilayer body can be heated are provided.

The multilayer bodies are used, in order to produce, for example, (in particular large-area) thin-film semiconductors, for example, thin-film solar cells or modules. Solar power systems are operated, e.g., with solar modules based on chalcopyrite semiconductors (e.g., $CuInSe_2$, abbreviated as "CIS" or $Cu(In,Ga)(S,Se)_2$, abbreviated as "CIGSSE"). Such thin-film solar modules have at least one substrate (e.g., glass, ceramic, metal foil, or plastic film), a first electrode (e.g., molybdenum Mo or a metal nitride), an absorber layer (e.g., $CuInSe_2$ or more generally $(Ag,Cu)(In,Ga,Al)(Se,S)_2$), a front electrode (e.g., ZnO or $SnO_2$), and encapsulation and covering materials (e.g., EVA/glass or PVB/glass, where EVA means ethylene vinyl acetate and PVB means polyvinyl butyral) as basic components. Other layers, such as alkali barrier layers between glass and Mo or buffer layers between an absorber and a window layer, can be used to improve efficiency and/or long-term stability. A substantial further component of a typical thin-film solar module is the integrated series connection that forms a series-connected chain from individual solar cells and thus enables higher operational voltages. In the following, in each case the chemical symbol for specific elements will be indicated, for example, "Mo" for molybdenum or "Se" for selenium. Laboratory experiments show that the currently known production methods can still be greatly improved and that by means of process engineering approaches and optimization, substantial cost savings can be achieved. Currently, there are various methods for production of thin-film solar modules based on chalcopyrite semiconductors. In a known two-step method, the so-called precursor layers Cu(Ga), In, and Se are deposited in a first step onto the cold substrate already provided with a Mo thin-film. This can be done, for example, by sputtering, electrodeposition, screen printing, vaporization processes, or chemical gas phase deposition. In a second step, the substrate coated in this matter is heated in a processing chamber (an appropriate furnace) in the absence of air, by running through a predefined tested temperature profile from room temperature up to ca. 600° C. During this tempering process, the desired chalcopyrite semiconductor is formed from the precursor layers in a complex phase transition. This process can be referred to as in-line processing, e.g., in-line selenization. Sulfurization is also possible in this manner. In-line tempering processes require reliable mastery of rapid CIS layer formation processes, as well as of likewise accelerated heating and cooling processes for large coated glass sheets, for instance. A layer package consisting of, e.g., copper, indium, and gallium, as well as a final covering made of elemental selenium is brought to relatively high temperatures at relatively high heating rates of up to a few K/s, at which the previously applied individual components react to form semiconductor compounds (rapid thermal processing, RTP, of layer stacks—precursor layers, SEL-precursor, stacked elemental layer). These substantially shorter reaction times compared to furnace processes, now enable a transfer to continuous processes. The process chamber has, e.g., a tunnel or forms a tunnel which, for example, can be sealed by airlocks or is provided as a closed process chamber. The process chamber is irradiated for heating by energy sources, i.e., for example, emitters disposed in matrices. The large-area processing of $Cu(In,Ga)(S,Se)_2$ (CIGSSE) chalcopyrite semiconductor on glass substrates, starting from SEL-precursors thus necessitates the following fundamental prerequisites: rapid heating rates in the range of a few K/s, homogeneous temperature distribution over the glass substrate (laterally) and over the substrate thickness, guarantee of adequately high, controllable, and reproducible partial pressure of the chalcogen elements (Se and/or S) during RTP (prevention of Se and/or S losses or other applied elements), controlled process gas feed (e.g., $H_2$, $N_2$, Ar, $H_2S$, $H_2Se$, S gas, Se gas), and maximum temperatures above 500° C. The industrial scale in-line methods are very complex in terms of process and plant engineering. This results in the fact that the investment costs for this process step consume a not insubstantial proportion of the overall investment costs of a solar manufacturing plant.

Consequently, the object of the invention is to design the thermal processing of multilayer bodies more efficiently and thus to reduce the investment costs, in particular for corresponding processing systems, thereby also reducing production costs. This object is accomplished by means of an arrangement of multilayer bodies, as well as a system and a method for processing multilayer bodies with the characteristics of the independent claims. Advantageous embodiments of the invention are indicated by the characteristics of the subclaims.

In particular, the object is accomplished by means of an arrangement of multilayer bodies, hereinafter referred to as "multilayer body arrangement". The multilayer body arrangement comprises at least two multilayer bodies each having at least one surface to be processed, as well as at least one device for positioning the at least two multilayer bodies, wherein the device is configured such that the respective surfaces to be processed are opposite each other and thus form a quasi-closed processing space disposed between the surfaces, in which, substantially, the processing occurs. The multilayer bodies are processable, in particular selenizable, as a multilayer body arrangement in a processing system. The multilayer bodies can have a certain distance between them, but the surfaces to be processed can also be situated directly on top of each other. A processing space is also possible. The multilayer bodies disposed, in particular, with a certain distance between them, thus form a substantially closed or quasi-closed processing space. In the context of the present invention, the expression "quasi-closed" describes a processing space that is open on the edge, but wherein at least during the period of the processing of the multilayer bodies virtually no gas exchange occurs between the processing space and its surroundings, such that no significant change of the process conditions occurs in processing space, since edge effects related to a gas exchange with the surroundings are negligible. In addition, a barrier gas-tightly sealing the processing space or a frame gas-tightly surrounding the processing space can be provided. In the multilayer body arrangement according to the invention, the two multilayer bodies are spaced relative to each other such that a gas exchange barrier or a pressure balance resistance is formed between the processing space open to the surroundings and the external surroundings, which prevents vaporizing layer components, process gases, or process reaction gases from passing over into the external surroundings in uncontrolled quantities. This can be achieved by an appropriate selection of the (non-zero) distance between the surfaces to be processed of the multilayer bodies across from each other, which depends on the volume of the processing space, the mean free path of the gas particles, or the respective partial pressures of the gases in the processing space. For example, a non-zero distance between the surfaces to be processed of the multilayer bodies opposite each other is less than 50 mm, preferably less than 10 mm, particularly preferably 1 to 8 mm, and can, with very thin multilayer bodies (e.g., films) even be less than 1 mm. These values are based on multilayer bodies whose surfaces to be processed have, in each case, for example, a size in the range from 100 $cm^2$ to 200000 $cm^2$. Advantageously, the (non-zero) distance between the surfaces to be processed of the multilayer bodies opposite each other is selected such that a loss of mass of gases in the processing space, for example, chalcogen components (S, Se), which, for example, arise by means of the heating process (vaporization and out-diffusion) is less than 50%, preferably less than 20%, particularly preferably less than 10%, quite preferably less than 1%, and even more preferably less than 0.1%.

Without a barrier or frame, by means of which the processing space is gas-tightly closed, there is, in the multilayer body arrangement according to invention between the edges of the surfaces to be processed of the multilayer bodies opposite each other, a (gas passage) opening of the processing space. This opening has, depending on the distance d between the two multilayer bodies, a certain opening area S. In the case of rectangular substrates with edge length a and b that are positioned at a distance d (distance between the two surfaces to be processed, that are opposite each other in the multilayer body arrangement), the opening area S at the substrate edges is indicated by the formula $S=(2 \cdot a+2 \cdot b) \cdot d$. On the other hand, a total processing area T on the two substrates, consisting of the coating surfaces of the two substrates, is processed in the processing space. The total processing area T is indicated by the formula $T=2 \cdot a \cdot b$ (two rectangular, coated substrates of edge length a and b). Considering the relationship of opening area S to the total processing area T (specified as $A=S/T$), it is advantageous in the multilayer body arrangement according to the invention for A to have a maximum value of 0.4, preferably a maximum value of 0.2, particularly preferably a maximum value of 0.02, and even more preferably a maximum value of 0.002.

An advantageous embodiment provides that the two multilayer bodies and a first spacing element or the two multilayer bodies and the first spacing element and a second spacing element are disposed relative to each other such that they form a substantially closed, i.e., a quasi-closed processing space, in the sense of a boundary between the reactive thin-film and the furnace environment or chamber space. In other words, the substrates form a cover element and a floor element of a process box, while the spacing element(s) are provided, for example, as sidewall elements of the process box. The sandwich of multilayer bodies is analogous in this case to a process box per se. The processing space is thus reduced in a desirable manner; only the surfaces to be processed are exposed to the process gas. This process variant seeks to ensure, by means of minimization of the chamber environment, an adequately high (e.g.) Se partial pressure even without using a process box per se.

An essential point of the invention consists in being able to simultaneously process two multilayer bodies, e.g., glass substrates with precursor coating, (dual substrate head-to-head RTP), since they are appropriately positioned or supported by the device for positioning (also a supporting device). The two substrates are coated with the precursor elements, e.g., Cu, Ga, In, Se, Na, with these coated surfaces to be processed disposed opposite each other. With retention of the process time, this results in doubled system throughput with a virtually constant system footprint and comparable system investment volume. In other words, the system design can be substantially retained.

The multilayer bodies to be processed already have, as already described above, a first coating (precursor). Additional elements are deposited onto these coatings and/or conversions occur in the coatings to convert the precursor into the desired semiconductor. Consequently, the surfaces opposite each other are referred to generally in the following as "coating", as "coated surfaces", as "coated side", as "surfaces to be processed", etc.

The invention refers not only to chalcopyrite semiconductors, but also to all applications of functional thin films on substrates (e.g., CdTe-semiconductors and related semiconductors in addition to the chalcopyrite semiconductors.

Preferably, the device (and thus ultimately the multilayer body arrangement) is or can be disposed in a process chamber or a process tunnel of the processing system with a chamber space (or tunnel space) and/or in a device for forming a reduced chamber space and/or on or abutting a carrying element for transporting the multilayer body arrangement by means of a transport device into the processing system (i.e., into the process chamber or the process tunnel) and out of it or to another location, appropriate for or provided for it ("can be disposed" can also be understood to mean "can be provided"). The device is thus, e.g., configured such that it can be disposed outside the processing system to receive the multilayer bodies in order to ultimately bring them into the chamber or the tunnel. To this end, for example, the transport device that moves the multilayer body arrangement and transports it into the system and out again is provided. For this, the device is preferably configured such that it is transportable with the transport device on the carrying element (a carrier, a type of transport device, such as a transport plate). The carrier alone can also form the transport device. The multilayer body arrangement can also be manually introduced into the system or be assembled directly therein. To consume the least possible process gas, it is expedient to reduce the chamber space and to provide a processing space per se. Consequently, at least partially transparent panes (e.g., made of glass ceramic) or panes highly absorbent for the selected energy source that function as a secondary energy source or as an energy transmitter can be disposed between the substrates and the energy sources, with these panes forming a defined processing space in order to reduce or minimize the vaporization of volatile components during the heating process. In certain phases of the process, additional process gases (e.g., $H_2$, $N_2$, Ar, $H_2S$, $H_2Se$, S gas, Se gas, and/or others) can be introduced into this processing space. This can be realized with a device for forming a reduced chamber space, e.g., a process box or a process hood. The device for positioning is configured such that it is or can be disposed in the process box or process hood.

An adequate amount of Se is necessary to ensure complete selenization of the metallic (e.g.) CuInGa-precursors. Se loss would result in an incomplete conversion of the precursor into the chalcopyrite semiconductor and thus in a clear loss of power of the solar module. Guaranteeing an adequate amount of Se is accomplished, e.g., through the use of the process box. The same is true for other such process. Process boxes can be designed either open or closed. With open boxes, no side walls or only partial side walls are present. With closed boxes, a floor element, a cover element, and side walls enclose the processing space substantially completely. Process hoods are, as a rule, configured for stationary retention in the processing system.

In a preferred embodiment, the device is configured such that the multilayer bodies are disposed sandwich-like on top of each other while in use and thus form a bottom multilayer body and a top multilayer body of the multilayer body arrangement. Thus, the coating or the surface to be processed is disposed on the top of the bottom substrate and on the bottom of the top substrate (face-to-face- or head-to-head-arrangement).

Preferably, the device can be disposed in the chamber space of the process chamber (or at a location suitable for or provided for it), or the device is configured such that the two multilayer bodies can be disposed thereon such that they and/or the device for positioning at least partially form the device for forming a reduced chamber space, preferably the process box. Thus, depending on the configuration, the multilayer bodies or the substrate can form the process box and can work without or even with additional side walls. The device for positioning can also form parts (e.g., at least parts of the side walls) of the process box. In this case, the reduced chamber space, i.e. the processing space, would then correspond substantially to the space between the multilayer bodies. Thus, it is possible, for example, to do without a process box per se.

The use of the substrate and/or the device for positioning as components of the process box has the advantage of being able to feed the process gases only where they are also used. Thus, it is possible to reduce or avoid any back side coating that might occur during processing. By means of the special arrangement of the substrates, they are, during processing, i.e., for example during selenization, no longer disposed inside a process box and are thus disposed outside the process gas environment. The substrate back sides are thus no longer exposed to any Se or S atmosphere. In other words, only the sides or surfaces to be processed are exposed to the process gas.

If a process box is provided to reduce the chamber space, the device for positioning according to the invention can be disposed directly inside it. Ultimately, the process box can then be conveyed with the multilayer body arrangement into the processing system (e.g., by means of the possible movable carrier or even manually). It is also possible to "assemble" the multilayer body arrangement outside the system and only introduce it into the system thereafter (e.g., by means of the carrier). In other words, the device is disposed on the carrier such that the assembled multilayer body arrangement can be brought into the system by means of the transport device. The process chamber of the system could then have, for example, the above-described process hood such that it is possible to operate with a reduced chamber space.

The device (per se) for forming a reduced chamber space and/or the device for positioning (which may form part of the device) are preferably configured such that the (reduced) space formed by the floor element and/or bottom substrate or cover element and/or top substrate has a suitable volume: it must not be too large, so not too large an amount of chalcogens (Se or S) or possibly even volatile reaction products vaporize (to be estimated based on the equilibrium vapor pressure at process temperature), but also not too small, so, in the event of temporary deflection of the substrate during the heating process, the substrate cannot touch the opposing counter plate. The distance between the counter plate and substrate should, for example, in each case, be roughly between 1 and 20 mm. However, in principle, even direct contact between the substrate and the counter plate would be possible.

In order for the radiation from the energy sources to be able to penetrate all the way to the surfaces to be processed, (as already indicated above) the intervening elements, such as floor element and cover element of the process box or even the process hood are implemented at least partially transparent, depending on the design of the energy sources. Between the substrate and the radiation sources, any elements must thus be implemented (to the extent the energy source arrangement necessitates this) as partially transparent or transparent panes (made, for example, of glass ceramic) or as panes highly absorbent for the selected energy source, which function as secondary energy sources or energy transmitters. If the sources are disposed, for example, in the interior of the process chamber (possibly even in the interior of the process box or hood, and if the multilayer body arrangement is also located, for example, inside the process chamber, the chamber walls (side walls, cover, and/or floor) can also be non-transparent. For example, glass ceramic, other ceramics, graphite, metals, and refractory glasses (selection) can be provided as materials for the floor and cover element and possible side wall elements (with a process box per se) or the process hood. Silicon carbide can also be provided for this. A carrier should also be implemented at least partially from partially transparent or highly absorbent material since it can remain in the system during processing.

Preferably, the device for positioning has at least a first spacing element that is configured to accommodate the top multilayer body and/or the bottom multilayer body, with the spacing element disposed at least partially between the two multilayer bodies such that they can be or are disposed with space between them and thus form the multilayer body arrangement. The spacing element must be configured such that the surfaces to be processed are freely accessible for the process gas; at the same time, the surfaces must be spaced such that they form a suitable processing space. If no process gas is to or must be additionally fed in, direct contact of the surfaces to be processed is also conceivable. Even then, there can be considered to be a processing space between the surfaces to be processed.

Since the multilayer bodies are preferably disposed sandwich-like and horizontal while in use, the top multilayer body can be placed on the spacing element (is thus accommodated by the spacing element on a top accommodation region). The bottom multilayer body abuts the spacing element on a bottom accommodation region (abutting is thus also understood as accommodation by the spacing element), with the bottom accommodation region disposed on one side of the spacing element that is opposite the side with the top accommodation region.

In an advantageous embodiment, the device for positioning has at least a second spacing element that is configured to accommodate the top multilayer body and/or the bottom multilayer body and is configured to accommodate the first spacing element such that the second spacing element, the bottom multilayer body, the first spacing element, and the top multilayer body can be or are disposed sandwich-like and thus form the multilayer body arrangement. With this configuration, each of the multilayer bodies can be disposed carried by one of the spacing elements, and the spacing elements can be stacked on top of each other. In other words, before the process, the bottom second spacing element is placed at a suitable location (in the process chamber or box, on the carrier, etc.) and first loaded with the bottom substrate or multilayer body, with the precursor layer side upward; after that, the first spacing element is put on, followed by loading with the top substrate or multilayer body, with the precursor layer side downward (loading to form a multilayer body arrangement). This arrangement facilitates the assembly of a multilayer body arrangement. The unloading after processing takes place correspondingly in reverse sequence. The first spacing element can, in principle, be designed such that it does not rest on the second spacing element, but rather also on the "suitable location", for example, on the carrier. The bottom (bottom while in use) of the bottom second spacing element can, with this design, also serve as a supporting surface for transport (for example, by a roller drive). The second or bottom spacing element can itself also assume the function of a carrier. The spacing elements can also be referred to as supporting elements: the first spacing element as the first supporting element, the second spacing element as the second supporting element. Supporting elements because the substrates or multilayer bodies abut against them or rest thereon. Preferably, while in use, the second spacing element can be disposed at least partially under the bottom multilayer body. Thus, a secure hold of the substrate is ensured. In an advantageous embodiment, the first spacing element and the second spacing element have, in each case, at least one support region, on which or against which the multilayer body(bodies) can be rested or abutted. During layering of the substrate, care must be taken that the coated sides be touched as little as possible to prevent contamination by touching or disruption of the process gas atmosphere on the contact surface (so layer quality of the absorber produced is not locally or totally compromised). This requirement is partially facilitated in that, for example, 15 mm of the edge region of each edge is removed anyway in a later process step and, consequently, is not part of the active layer. Preferably, the first spacing element and/or the second spacing element has, in each case, at least one frame element and/or a frame strip element such that the multilayer bodies, preferably on their edge regions (on the margin) can rest at least partially on the frame element and/or the frame strip element or can abut against the frame element and/or the frame strip element. The frame elements or frame strip elements enable the least possible contact of the multilayer bodies, i.e., for example, of the substrates, with them (i.e., with the frame elements) to keep the surfaces to be processed as free as possible. An advantageous embodiment provides that the two multilayer bodies and the first spacing element or the two multilayer bodies and the first spacing element and the second spacing element are disposed relative to each other such that they form a substantially closed, i.e., a quasi-closed processing space, in the sense of a boundary between the reactive thin-film and the furnace environment or chamber space. In other words, the substrates form a cover element and a floor element of a process box, while the spacing element(s) are provided, for example, as sidewall elements of the process box. The sandwich of multilayer bodies is analogous in this case to a process box per se. The processing space is thus reduced in a desirable manner; only the surfaces to be processed are exposed to the process gas. This process variant seeks to ensure, by means of minimization of the chamber environment, an adequately high (e.g.) Se partial pressure even without using a process box per se.

For the most part, the multilayer bodies are rectangular or square. Preferably, the first spacing element and/or the second spacing element are also preferably configured rectangular or square preferably substantially replicating the contours of the multilayer bodies and thus have, in each case, at least one rectangular or square frame element. With this design, the substrates then rest on their edges on the respective frame elements such that the surfaces to be coated or to be processed remain free. Care must be taken that the multilayer bodies rest on the spacing element or abut it over an adequately large supporting surface.

In another embodiment, the first spacing element and/or the second spacing element have two frame strip elements (strips) that are opposite each other while in use in a plane of extension of the multilayer bodies, such that the multilayer bodies, preferably on their edge regions, e.g., on their longitudinal sides, can rest at least partially on the frame strip elements or can abut the frame strip elements such that, for example, in each case, on the transverse sides of the multilayer body arrangement, at least one opening area is formed to feed and/or evacuate the process gas into and/or out of the processing space. The arrangement can also be implemented in the other direction, i.e., on the longitudinal sides of the multilayer body arrangement, in each case, at least one opening area is formed to feed and/or evacuate the process gas into and/or out of the processing space. In other words, there are preferably at least two opening areas opposite each other on which no frame strip elements are provided. In the case of square substrates, no distinction is made between longitudinal sides and transverse sides.

It is also possible to configure the frame strip elements such that they extend, in each case, around at least two diagonally opposite corners of the multilayer body arrangement. The remaining open regions that are provided both on the longitudinal sides and on the transverse sides of the arrangement serve for gas exchange. The processing space thus configured is quasi-open and enables rapid process gas feed or evacuation. The term "quasi-open" in this context thus means enabling a partial gas exchange between the substrate environment and the furnace (chamber) environment.

As already described above, the multilayer bodies should rest at least partially on the support regions of the spacing elements on or abut them. If the multilayer bodies are supported completely along their contours, a substantially closed processing space can be formed. In the case of partial support, opening areas that enable an exchange of the process gas with the atmosphere in the chamber space are provided. In the case of frame strip elements that are, for example, disposed only on the longitudinal sides of the substrates, these opening areas exist with no additional effort. Various embodiments that result in a quasi-open frame are also conceivable. The variant "quasi-open processing space" is of interest in particular for the tunnel design and hood design of RTP processing (process gas feed to the precursor layers as the surfaces to be processed of the substrate sandwich in the hood or in the tunnel).

With an arrangement of the frame elements or frame strip elements on the multilayer body edges or substrate edges along the transport direction, it is conceivable to configure the frame elements or frame strip elements such that guidance of the substrate sandwich in the transport direction can occur.

In particular, in the case of quasi-closed systems, another capability for the feed and evacuation of the process gas must be provided. In the RTP process, the process gases $H_2$, $N_2$, Ar, $H_2S$, $H_2Se$, S gas, Se gas, for example, can be used and introduced into the furnace interior, i.e., into the chamber space or into the interior of the process box at selected process times. It is thus also possible to perform the sulfurization process with gaseous sulfur (S) or the selenization process with gaseous selenium (Se). To enable the process gas feed to the thin-film precursor (i.e., to the multilayer body) in the structure presented here during the RTP process, a process gas feed via the frames is proposed. In the selenization process, the selenium present in the precursor is converted under a process gas atmosphere such that the desired semiconductor structure is obtained. It is also possible to additionally provide selenium in the process gas (Se gas), depending on the desired result. The conversion of the precursor selenium is, however, also possible without selenium per se in the process gas. Consequently, the first spacing element and/or the second spacing element preferably have a gas feed element and/or gas evacuation element to feed and/or to evacuate a process gas into and/or out of the processing space. The gas feed element or gas evacuation element can, for example, be configured as a gas diffusion comb integrated into the first spacing element and/or the second spacing element with at least one connector element to connect a gas feed line and/or gas evacuation line. In this case, the process gas feed (and also process gas evacuation) thus takes place via the spacing element(s) (partial or adaptable gas exchange between the furnace environment (e.g., hood environment, tunnel environment) and precursor thin film). The configuration of the comb and the docking elements or docking rods can vary, for example, relative to the number of gas outlets ("comb teeth"). Thus, the corresponding spacing element can, for example, be implemented hollow and with openings for the gas outlet (or inlet). Corresponding lines via which the gas can be fed or also evacuated can then be connected via the connector element (or the connector elements). In principle, the gas diffuser can also be otherwise disposed on the chamber and/or the process box or hood. It is important to enable a substantially homogeneous introduction of the process gas from a gas source, e.g., an external gas source, all the way to the substrate (via the process chamber or the process tunnel, or if there is no process chamber or process tunnel, only into a possibly present process box or hood) such that there is the most laminar gas flow possible over the substrate surface from, for example, one longitudinal edge to the other. The gas feed can be controlled at predefined inlets of the gas diffuser at any times during the tempering profile. Consumed quantities of the process gas can thus be reloaded and/or no longer desired excess (for example) selenium vapor (and/or other components of the vapor) can be forced out of the reaction chamber at the right time. During the RTP processing, substrate deformation must be contended with, if necessary, since, in particular, the top substrate is more or less floatingly mounted (if it is not resting directly on the bottom substrate). It is conceivable that, at high process temperatures, sags might occur that are manifested after processing in substrate deformations. Consequently, in an advantageous embodiment, the first spacing element and/or the second spacing element have, in each case, at least one cross-connection element to connect regions of the respective frame element opposite each other in the plane of extension of the multilayer bodies or of frame strip elements opposite each other while in use such that the multilayer body(bodies) can be additionally supported to prevent bending. The cross braces also serve to stabilize the frame or the frame elements or the frame strip elements. In the design of the cross braces or cross-connection elements, a minimal width must be ensured (but adequate to guarantee the desired stability) in order to minimize shadowing of the radiation of the (heat) emitters or the energy sources. Since the cross-connection element can be pulled substantially "crosswise" over the surface to be processed, the contact between the cross connection element and the surface must be kept as little as possible. To this end, the cross-connection element can have at least one support element such that the multilayer bodies can abut against or rest on the cross connection element via the support element, with the support element configured such that it has the same height as the respective at least one frame element or frame strip element (flat resting of the substrates on the frame (strip) element(s) and the support element). Preferably, the support element is configured as a point support element, preferably as a spherical element. Thus, the smallest possible support area or even system footprint is guaranteed. Even less shadowing is achieved by means of needle-shaped elements. In a preferred embodiment of the invention, the at least one frame element or frame strip element has (or the frame strip elements have) at least two support elements such that the multilayer bodies can abut against or rest on the support elements such that, on the transverse sides and/or longitudinal sides of the multilayer body arrangement, in each case, at least one opening area is formed to feed and/or evacuate the process gas into and/or out of the processing space. In other words, the support region can be reduced even on the frame element or the frame strip element, if this/these is/are configured with the support elements. This approach results again in a quasi-open frame design with the combination possibilities already stated above with the tunnel or hood RTP concept (process gas feed through the environment). Conceivable advantages of this support element concept, i.e., for example, a point support element concept, compared to the above described frame elements or frame strip elements without support elements, are smaller contact areas with the substrates and thus a reduction of possible local disruptions. In addition, a reduction of substrate deformation results from the introduction of support points in the substrate interior.

Preferably, the first and/or the second spacing element is made of graphite or quartz glass; glass ceramic, other ceramics, and refractory glasses are also conceivable. The frame material should be inert, resistant in a corrosive environment (containing S, Se), and mechanically stable. Due to the direct contact with the substrates, the thermal conductivity and the coefficient of thermal expansion must also be considered in order to avoid lateral inhomogeneities of temperature distribution on the substrate as much as possible and to prevent layer delamination or damage. Frame materials and also support elements can be made from graphite or quartz glass, glass ceramic, other ceramics, or refractory glasses (e.g., graphite spheres). In the selection of materials for the point supports, the following material properties must also be taken into account: inert material, corrosion resistance, mechanical stability, thermal conductivity, and thermal coefficient of expansion. The use of graphite spheres, for example, in combination with a graphite frame element or frame strip element is, for example, conceivable.

With the present invention, independent protection is claimed for a multilayer body arrangement, comprising at least two multilayer bodies each having at least one surface to be processed, and at least one device for positioning the at least two multilayer bodies, as is described above. The at least two multilayer bodies are disposed such that the respective surfaces to be processed are opposite each other and the multilayer bodies thus form a quasi-closed processing space between the surfaces, in which the processing substantially occurs. With this arrangement, it is possible to do without a device for positioning per se; instead, the substrates lie on each other with their surfaces to be processed, e.g., in the process box or even in the process chamber.

This arrangement is, in particular, suitable when no process gas for processing has to be fed into the space between the surfaces to be processed. The device for positioning can be introduced into the process chamber and removed from it again. The multilayer body arrangement is expediently assembled outside the processing system and then transported into the system or even manually inserted so it can be subjected there to the desired process (e.g., selenization of the substrate). It is also possible to dispose the device for positioning in the process chamber such that the multilayer body arrangement can be assembled therein. The multilayer bodies can also be arranged without the device. After the conversion of the substrate into the desired chalcopyrite semiconductors, the arrangement can be removed from the chamber space in its entirety or the individual parts can be removed.

Independent protection is also claimed for a system for processing, in particular, for selenizing, at least two multilayer bodies, each having at least one surface to be processed, comprising at least one process chamber with a chamber space (or even a tunnel with a tunnel space), and a device for positioning the at least two multilayer bodies, as is described above. Preferably, the system has at least one energy source for heating the multilayer bodies. Preferably, the energy source is disposed in the process chamber or in the processing system such that each of the multilayer bodies is, in each case, heated from the side that is disposed facing away from the surface to be processed (substrate back side(s)). For this, for example, two energy sources can be provided: one for the bottom multilayer bodies, one for the top multilayer bodies (in other words, in each case, at least one energy source is provided for each of the multilayer bodies). Thus, the multilayer bodies, i.e., for example, the substrates, can be heated via their back sides, i.e., via the sides that are disposed in each case facing away from the surfaces to be processed.

The configuration of the energy sources can be varied. As already described above, the heating of the substrates or the multilayer bodies occurs substantially only one-sidedly by means of the heating of the respective back side of the multilayer body or the back side of the glass. The top substrate is heated only from above; the bottom one is heated only from below. Direct heating of the coated surfaces opposite each other does not occur. Accordingly, in the selection of the energy source, care must be taken that adequate heat is available on the surfaces to be processed (heating rate), because the part of the spectrum of the radiation source that is already absorbed in the substrate glass only reaches the layer by thermal conduction with somewhat of a delay. The higher the proportion of power that is first absorbed in the molybdenum, the greater the heating rates obtainable. The substrate glass absorbs, for example, at wavelengths above ca. 1.5 µm and below 350 nm. The pane could break or have excessive deformation due to one-sided heating. Since the thickness of the glass is only 2-3 mm and a large proportion of the radiation is first absorbed in the Mo, it is not to be anticipated that with heating rates in the range of a few K/s, vertical gradients can be produced in the glass. Much more important for low breakage rates is the lateral homogeneity of the heating (in the substrate surface). The energy source must be provided accordingly. Experience has shown that it is also very important to optimize lateral homogeneity during cooling. With the cooling rates obtainable in this arrangement, it is not to be anticipated that stresses can develop in the glass due to vertical gradients between the layer side (i.e., coated side) and the back side.

A preferred embodiment provides that at least one device for forming a reduced chamber space is provided that can be or is disposed in the process chamber, preferably a process box or a process hood. Such devices reduce the actual space that is available for processing and form a processing space per se. Advantageously, the process box has at least one cover element and at least one floor element, between which the at least two multilayer bodies can be disposed. In this case, the bottom multilayer body can be placed on the floor element, then, at least spacing element, preferably a frame element or two frame strip elements, is placed on it, and the top multilayer body again on top of the spacing element. The process box is closed by means of the cover element. Thus, the multilayer body arrangement is accommodated in a defined manner inside the process chamber of the system. The process box can be substantially completely closed with additional side wall elements. Any open areas could serve for gas exchange. The process box can be introduced into the process chamber and removed therefrom.

The device for forming a reduced chamber space can also be configured as a process hood. In this case, the process hood is, for example, configured as a cover stationarily disposed in the treatment chamber. Consequently, the gas exchange between the processing space and the chamber space is clearly reducible. Also, if there is no chamber space, the processing space can be connected directly to a (for example, external) gas source.

As already described above, the process box can be formed at least partially by the multilayer body arrangement. The materials are selected, for example, as described above.

Method-wise, the above-mentioned object is accomplished by means of a method for processing at least two multilayer bodies each having at least one surface to be processed. In the method, the two multilayer bodies are disposed such that the respective surfaces to be processed are opposite each other and thus form a quasi-closed processing space disposed between the surfaces, in which the processing occurs. Preferably, the following further step is provided: Arranging the device in a processing chamber or a process tunnel of the processing system with a chamber space and/or in a device for forming a reduced chamber space and/or on or abutting against a carrying element for transporting the multilayer body arrangement by means of a transport device into the processing system (i.e., into the process chamber or into the process tunnel) and out of it or to another suitable location. In an advantageous implementation of the method, the step of arranging the device can be provided as follows:

Arranging in a process box with a floor element, a cover element, and preferably with side wall elements as the device for forming a reduced chamber space or Arranging inside or under a process hood, that is configured, in particular, for stationary retention in the processing system, as the device for forming a reduced chamber space.

Preferably, the method comprises the step of arranging the two multilayer bodies on the device for positioning sandwich-like on top of each other while in use such that a bottom multilayer body and the top multilayer body are provided. The bodies lying horizontally while in use can thus be most uniformly and most reliably processed. Preferably, the following further step is provided: Arranging the two multilayer bodies on the device or in the chamber space of the process chamber or in the tunnel of the processing system (or at another location provided therefor) such that the two multilayer bodies and/or the device for positioning at least partially form the device for forming a reduced chamber space, preferably a process box. In an advantageous implementation, the method comprises the following additional steps:

Arranging the top multilayer body and/or the bottom multilayer body on a location provided therefor, Arranging at least one first spacing element, which is included in the device for positioning (i.e., is part of the device for positioning) at least partially between the two multilayer bodies such that they are arranged with space between them and thus form the multilayer body arrangement.

Moreover, in an advantageous implementation, the method includes the following additional steps:

Arranging at least one second spacing element, which is included in the device for positioning (i.e., is part of the device for positioning), at a location provided therefor, Arranging the bottom of the layer body on the second spacing element, Arranging the first spacing element on the second spacing element, Arranging the top multilayer body on the first spacing element, such that the second spacing element, the bottom multilayer body, the first spacing element, and the top multilayer body are disposed sandwich-like and thus form the multilayer body arrangement.

The first spacing element can optionally also be disposed directly on the location provided therefor, e.g., in the chamber space, on the floor element of a process box, or on a carrier. The first spacing element must be appropriately designed for this.

As already described above, the multilayer body arrangement can be assembled outside the processing system, e.g., in the process box, which is, for example, transported with the carrying element or directly on the carrying element. The arrangement can then be transported into the processing system by means of the carrying element. It is also possible to transport the arrangement without a carrying element, e.g., with a roller drive. Even manual introduction of the arrangement (both the individual components and also the entire previously assembled arrangement) into the processing system is possible. Moreover, the bottom spacing element can serve as a carrying element and/or transport element. Provision is further made to introduce the positioned multilayer bodies into the processing system, to process them, and to remove them again from the system. This is, for example, possible by means of the already described transport device or even manually.

Another method for positioning at least two multilayer bodies each having at least one surface to be processed comprises:

Arranging the two multilayer bodies such that the respective surfaces to be processed are opposite each other and the multilayer bodies thus form a quasi-closed processing space disposed between the surfaces, in which, substantially, the processing occurs, such that the at least two objects are processable, in particular selenizable, as a multilayer body arrangement in a processing system. In concrete terms, this means, for example, arranging the bottom multilayer body in the process chamber, in the process box, on a carrier, or on another suitable location and placing the top multilayer body on the bottom one such that the surfaces to be processed are opposite each other. This can be referred to as a processing space even though the substrates rest directly on top of each other.

With the method steps just described for assembly of the multilayer body arrangement, the multilayer bodies or substrates can be precisely positioned such that their processing can be performed in a corresponding system with high throughput and in an efficient manner.

The invention further extends to the use of a multilayer body arrangement as described above as well as a method as described above for production of a thin-film solar cell or thin film solar module, which preferably includes as a semiconductor layer a chalcopyrite compound, in particular Cu(In, Ga)(S,Se)$_2$. Preferably, the use serves to produce a CIS or (CIGSSe) thin-film solar cell or a CIS or (CIGSSe) thin-film solar module, wherein, in particular, each multilayer body is implemented in the form of a glass pane and is coated with at least the elements Cu, In or Cu, In, Ga or Cu, In, Ga, selenium for the selenization and/or sulfurization of a chalcopyrite thin-film semiconductor.

It is understood that the various embodiments of the objects of the invention can be realized individually or in any combinations. In particular, the above mentioned characteristics and those to be explained in the following can be used not only in the combinations indicated but also in other combinations or alone, without departing from the framework of the present invention.

Figure 2:
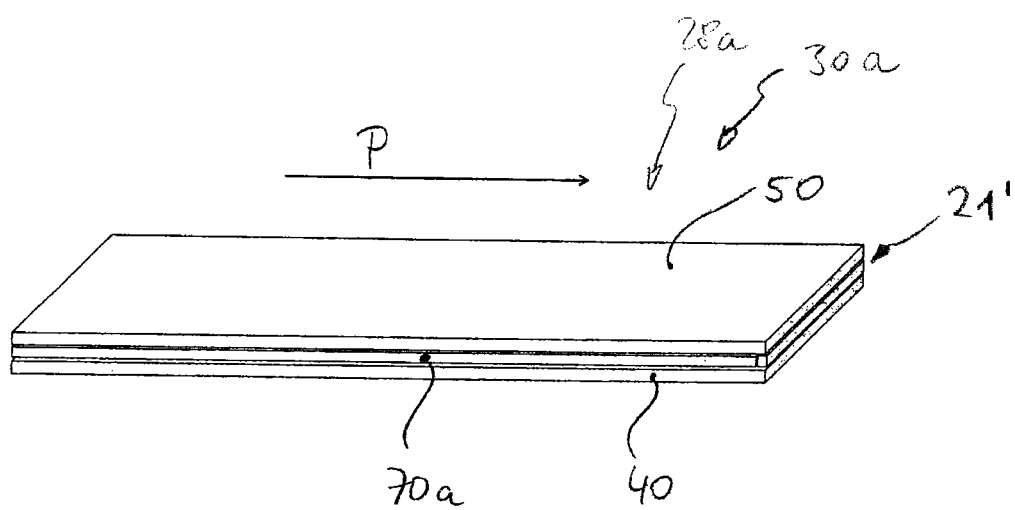
Figure 3:
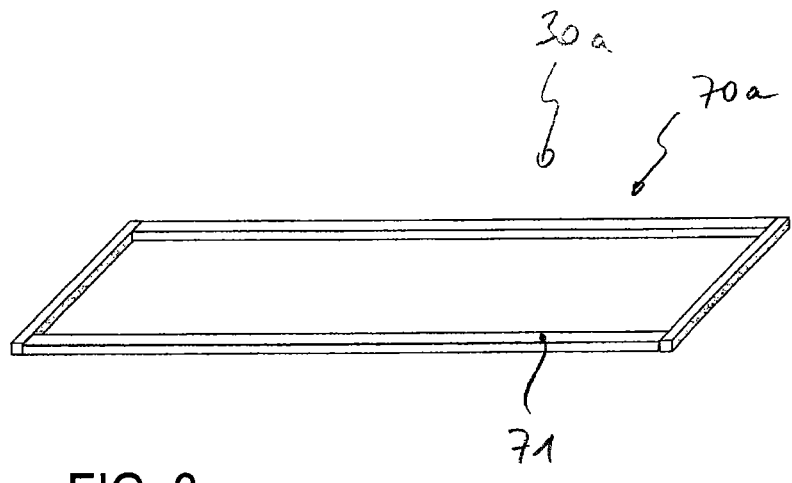
Figure 4:
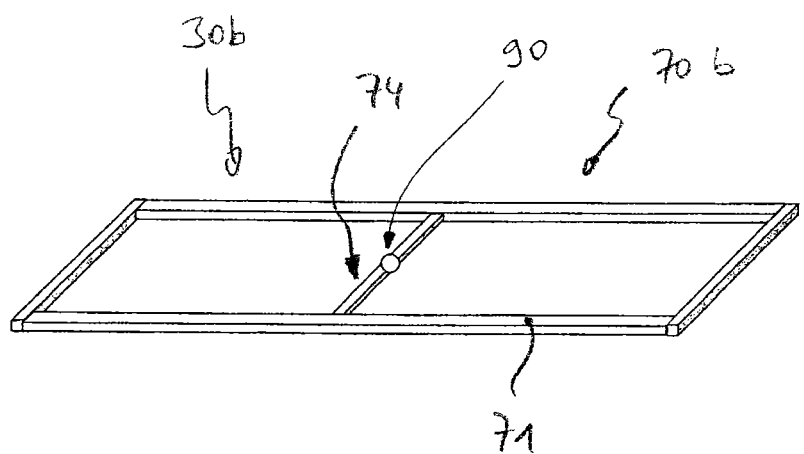
Figure 5:
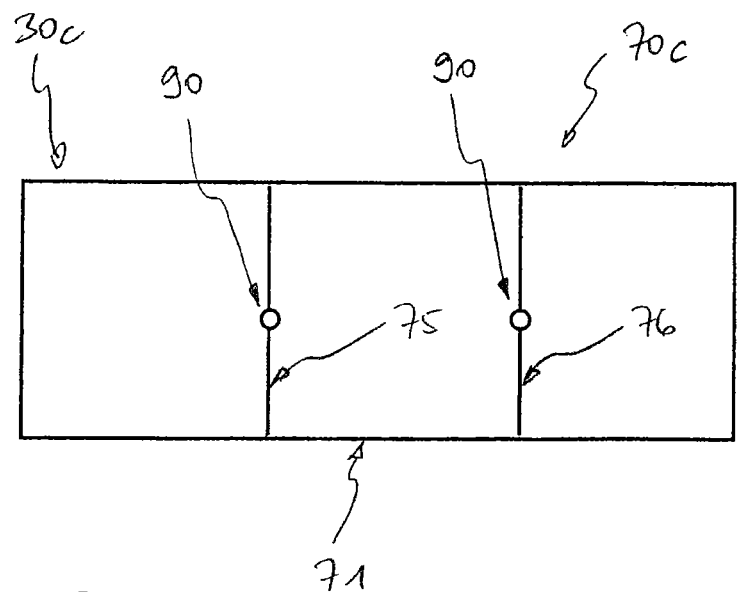
Figure 6:
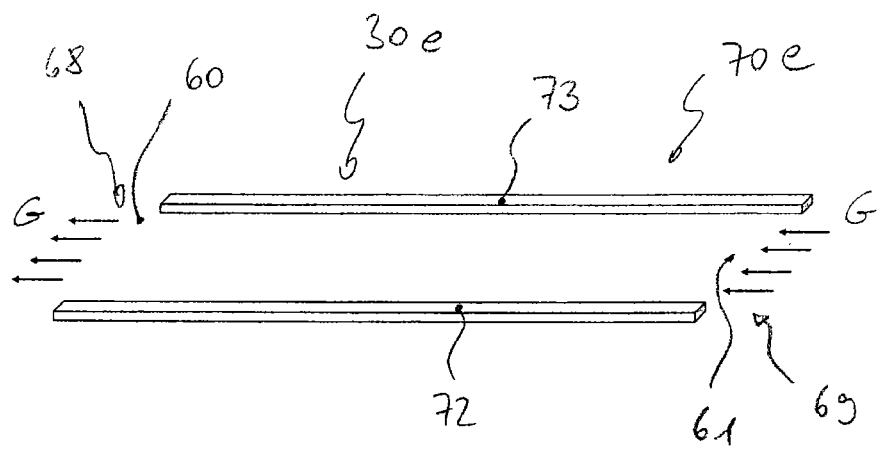
Figure 7:
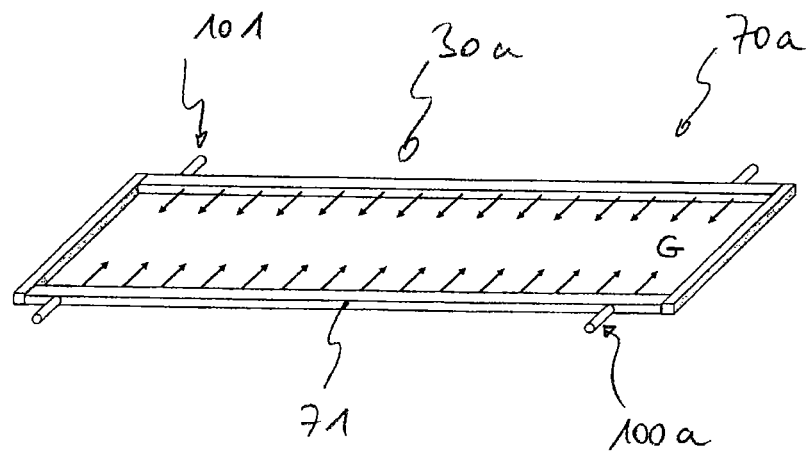
Figure 8:
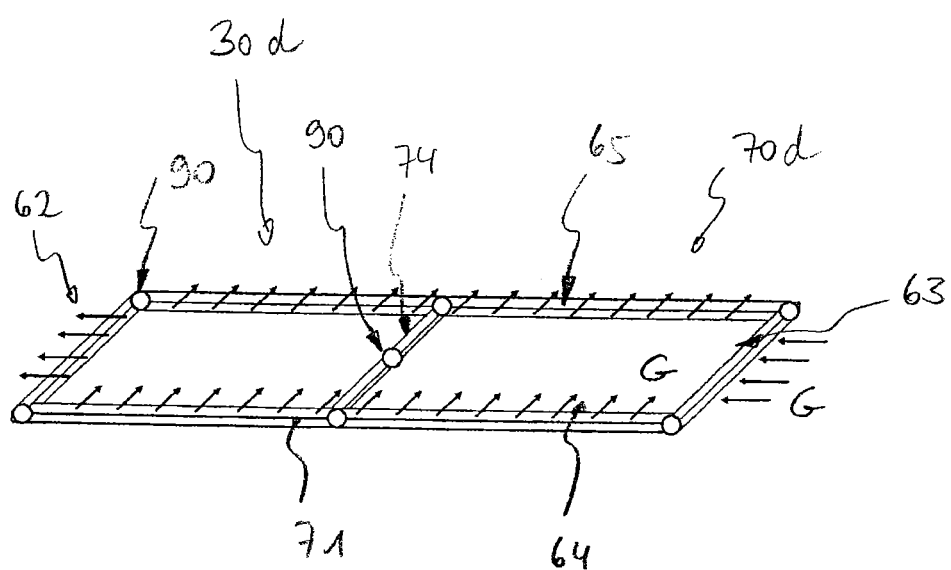
Figure 9:
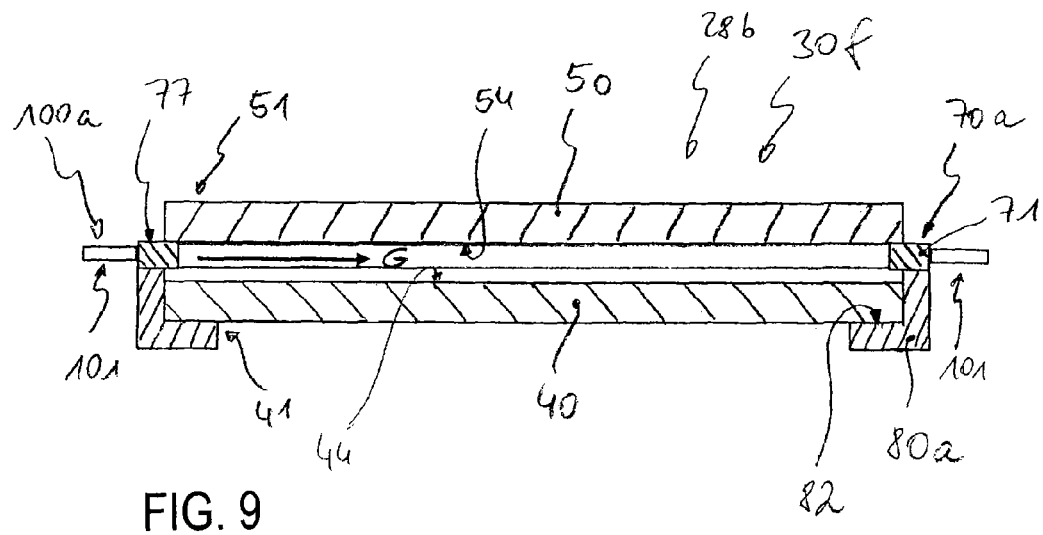
Figure 10:
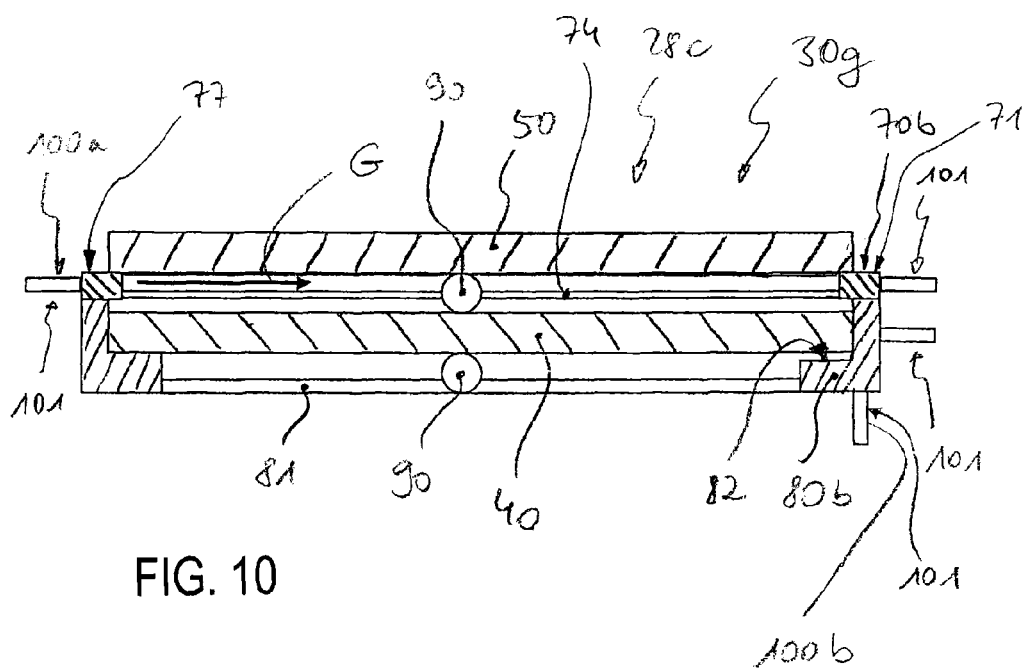
Figure 11:
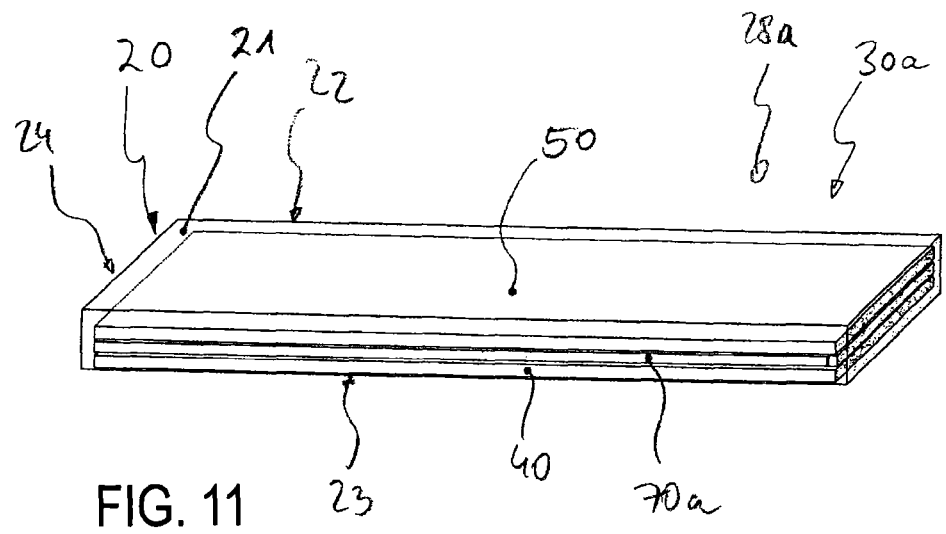
Figure 12:
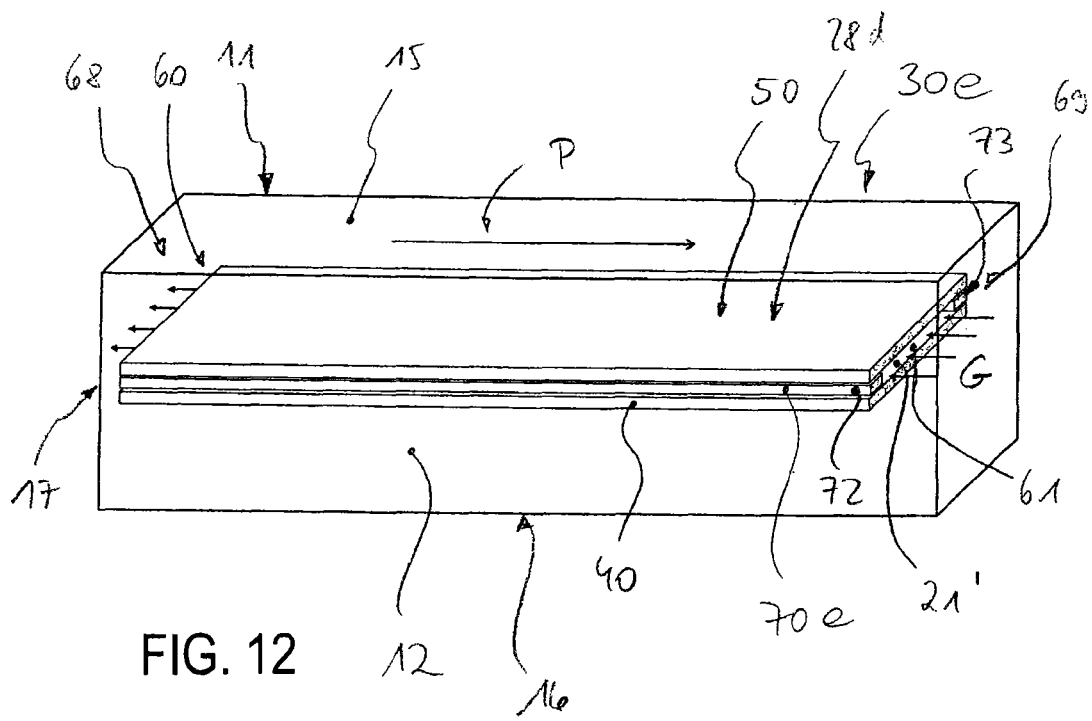
Figure 13:
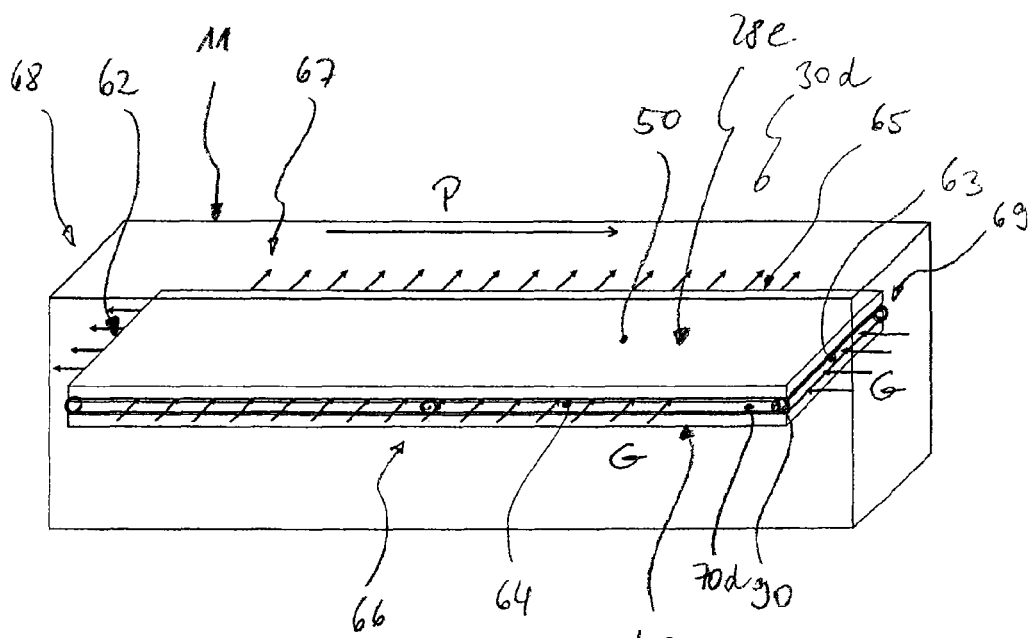
Figure 14:
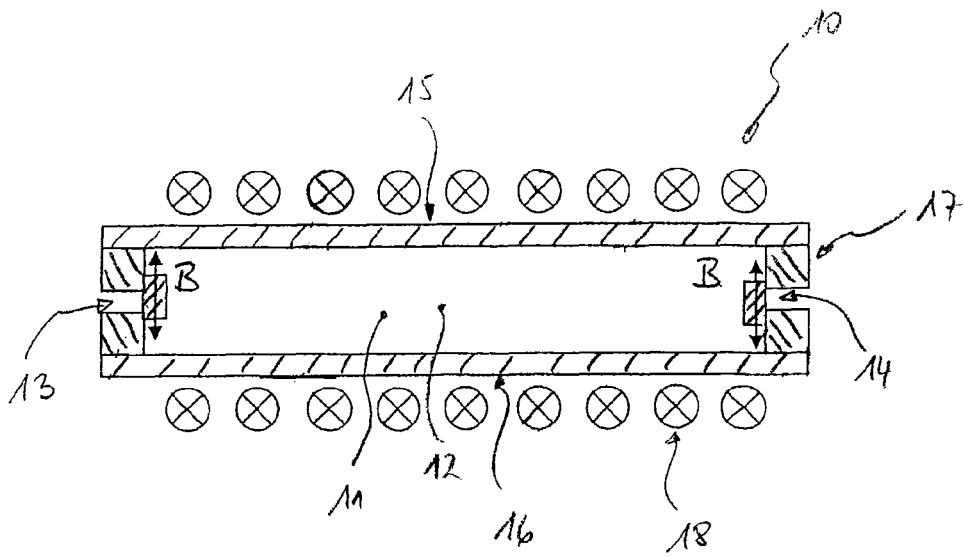

In the following, the invention is described with reference to exemplary embodiments that are explained in detail with reference to the drawings. They depict:

FIG. 1 an arrangement according to the invention (schematic) in a perspective view;

FIG. 2 an embodiment of a device for positioning or arrangement in a perspective view;

FIG. 3 a spacing element as provided in FIG. 2, in a perspective view;

FIG. 4 another spacing element in a perspective view;

FIG. 5 another spacing element in plan view;

FIG. 6 another spacing element in a perspective view;

FIG. 7 the spacing element of FIG. 2 or 3 in a perspective view;

FIG. 8 another spacing element in a perspective view;

FIG. 9 another embodiment of the device or arrangement in a cross-sectional view;

FIG. 10 another embodiment of the device or arrangement in a cross-sectional view;

FIG. 11 the embodiment of the device or arrangement of FIG. 2 in a process box, in a perspective view;

FIG. 12 another embodiment of the arrangement in a processing chamber, in a perspective view;

FIG. 13 another embodiment of the arrangement in a processing chamber, in a perspective view;

FIG. 14 a system for processing in a cross-sectional view.

In the following description, the same reference characters are used for identical and identically functioning parts. FIG. 1 depicts an arrangement of two objects as can be produced with a device according to the invention. The objects are implemented as multilayer bodies, here as substrates 40, 50 that are provided for processing, in particular, for selenizing. The substrates have, on a surface 44, 54, a coating (precursor) 45, 55 (surfaces to be processed). The coating (a layer package consisting of, e.g., copper, indium, and gallium as well as a final covering made of elemental selenium, precursor) is to be brought to relatively high temperatures in a processing chamber with relatively high heating rates of up to a few K/s such that the previously applied individual components react to form semiconductor compounds (rapid thermal processing, RTP, of layer stacks—precursor layers, SEL-precursor, stacked elemental layer). Thin-film semiconductors can be produced in this manner, for example, thin-film solar cells or thin-film solar modules. Solar power systems are operated, for example, with solar modules based on chalcopyrite semiconductors (e.g., CuInSe$_2$, abbreviated as "CIS" or Cu(In,Ga)(S,Se)$_2$, abbreviated as "CIGSSE"). FIG. 1 depicts the schematic of the arrangement according to the invention with two multilayer bodies or substrates 40, 50 to be processed and it can be integrated into a system for processing. FIG. 14 depicts such a system in a lateral view 10. The system 10 is designed to process large-area substrates. To be discerned is (cf. FIG. 14) that the system has a process chamber 11 with a chamber cover 15, a chamber floor 16, chamber walls 17 (and, consequently, with a chamber space 12), an entry door 13, and an exit door 14 opposite the entry door. The process chamber 11 or treatment chamber has, in this case, e.g., a tunnel or forms a tunnel, which can, for example, be sealed with the doors (airlocks). The arrows B indicate the direction of movement of the entry door or the exit door. For the transport of the at least two multilayer bodies or of the multilayer body arrangement (not shown), a transport device (not shown) that can transport the substrate through the doors or airlocks 13, 14 through the process chamber 11 is provided. Manual introduction is also possible. Above and below the process chamber 11, a plurality of point sources 18 for electromagnetic radiation are arranged, for example, as a matrix. A different type of source and/or a different arrangement of these sources is also possible. For passage of the radiation, the chamber cover 15 and the chamber floor 16 of the process chamber 11 are configured at least partially transparent at least in regions to enable homogeneous energy action on the substrates. The energy sources can also be disposed inside the chamber 11; then, the walls of the process chamber can also be nontransparent. It is also possible to dispose the energy sources in the corresponding walls or wall sections of the chamber and/or the walls such that they serve under the effect of energy sources as secondary emitters.

Back to the device or arrangement according to the invention. The multilayer bodies 40, 50 are disposed relative to each other such that the surfaces coated and to be processed 44, 54 are opposite each other (head-to-head- or face-to-face-arrangement, head-to-head-RTP). The substrates 40, 50 are positioned horizontally while in use and are disposed sandwich-like on top of each other. It is thus possible to refer to a bottom multilayer body 40 or a bottom substrate and a top multilayer body 50 or a top substrate. It should be noted that the multilayer body arrangement is depicted "freely floating" here. This is intended to demonstrate only the schematic structure of the at least two substrates, as they are processed in the system. Their positioning possibilities are described in detail in the following. With such an arrangement of the substrates 40, 50, a defined space between the surfaces to be processed 44, 45 can be formed. In addition, the two substrates 40, 50 are processed, i.e., selenized, for example, simultaneously, such that throughput through the system significantly increases (as depicted, for example, by FIG. 14). The defined space between the substrates, the so-called processing space 21', can thus, for example, be selectively filled with a specific amount of a process gas for the performance of the processing. In other words, the processing ultimately substantially takes place inside the processing space 21'. In the above-described system 10, it is often desirable to reduce the chamber space 12 of the process chamber 11 in order to be able to better control the process gas feed or also the process gas evacuation and also the process gas amount. In a defined space, the processing, i.e., the conversion of the coated substrate surfaces, for example, can be more readily calculated and replicated. In this respect, the defined processing space is expedient. Often, in known chamber spaces of a process chamber, a device for forming a reduced chamber space (and thus for the forming of the already described processing space) can be or is disposed. Such devices are provided, for example, as so-called process boxes, inside the process chambers in which the substrates to be processed are accommodated. Also know are process hoods that are placed above the substrates to be processed (lowered onto the substrates) and rest on the bottom substrate, on the chamber floor, or on a support per se. With the device or arrangement according to the invention, it is now possible to already provide a defined processing space 21', since the substrates 40, 50 are opposite each other. However, depending on the requirements of the processing, process boxes 20, hoods, or like devices per se for forming a reduced chamber space can also be used (cf., for example, FIG. 11). If no devices 20 for forming a reduced chamber space are provided, the substrates 40, 50 also at least partially form this device, i.e., for example, the process box. The arrow P indicates the process direction, in other words, the direction in which the multilayer arrangement is guided in the system for processing.

FIG. 2 depicts an embodiment of a device 30a for positioning or a multilayer body arrangement 28a. In order to position the substrates 40, 50 (of FIG. 1), to assemble them into the multilayer body arrangement, and process them in the corresponding system, the device 30a for positioning here comprises at least one (first) spacing element or even supporting element 70a. The spacing element 70a is disposed between the substrates 40, 50 and spaces them at a distance from each other. Here, the top substrate 50 rests on the spacing element 70a, whereas the bottom substrate 40 abuts against the spacing element 70a. The substrates thus positioned form the multilayer body arrangement 28a.

FIG. 3 depicts the spacing element 70a alone. As is discernible, the spacing element 70a has a frame element 71 (or is designed as such). In this case, the frame 71 replicates the contours of the substrates (not shown) (rectangular, here), such that they rest on the frame element 71 with its edges or edge regions 41, 51 or abut against it. Further measures, to be described in the following, must be taken for the positioning of the bottom substrate 40.

FIG. 4 depicts another embodiment of a device 30b for positioning, in this case, a spacing element 70b. The spacing element 70b, here again, a frame element 71, has a cross-connection element 74 to connect regions of the frame element 71 opposite each other. Thus, bending of a supported substrate can be prevented. However, in order not to excessively cover the surfaces to be processed 44, 54, the cross-connection element 74 has at least one support element 90, on which or against which the substrate or the substrates (not shown) can rest or abut. In this case, the support element 90 is configured such that it has the same height as the other frame element 71. Only in this manner is a flat support area for the substrates 40, 50 guaranteed. Both the frame element 71, and the cross-connection element 74 can have one or even a plurality of support elements. This reduces the support regions such that the substrates lie as freely as possible on the surfaces to be processed 44, 54. The number of cross-connection elements and of support elements can be freely selected and is variable as necessary. The arrangement of the support elements is also variable, in other words, the support elements can be disposed on the frame elements and/or on the cross-connection elements. The support elements 90 are preferably, as is discernible in FIG. 4, configured as point support elements, i.e., spherical. With the spherical elements, only small support regions are provided. Needle-shaped support elements are also conceivable.

FIG. 5 depicts another embodiment of a device 30c for positioning, here, a spacing element 70c (frame element 71), here, with two cross-connection elements 75, 76, on which a point support element 90 is disposed in each case.

FIG. 6 also depicts another embodiment of a device 30e for positioning, here, a spacing element 70e. The spacing element 70e has, in a plane of extension of the substrates (not shown), frame strip elements 72, 73 that are opposite each other while in use such that the substrates can rest at least partially on their edge regions, e.g., on their longitudinal sides, on the frame strip elements 72, 73 or can abut against the frame strip elements. On the transverse sides 68, 69, in each case, at least one opening area 60, 61 is provided on the multilayer body arrangement (indicated here) (cf., for example, FIG. 12). It is, of course, also possible to provide the opening areas on the longitudinal sides. The arrows G indicate the flow direction of the process gas. This is described in greater detail in the following.

FIG. 7 again depicts, finally, the spacing element 70a (cf. FIG. 3); however, here devices (or a device) 100a are provided for feeding and/or evacuation of process gas. Here as well, the arrows G indicate a possible flow direction of the process gas. As already described above, the processing of the coated substrate surface or the substrate coating is performed under a process gas atmosphere, in order, for example, to thus obtain the desired chalcopyrite semiconductor. Process gases provided can be, for example, $H_2$, $N_2$, Ar, $H_2S$, $H_2Se$, S gas, and/or Se gas, i.e., possibly—depending on the type of processing —also gaseous selenium and/or gaseous sulfur. In principle, processing even without process gas would also be possible, for example, in a completely closed process box. In this case, the substrates could also lie directly on each other and thus form a minimized processing space. The process gas must be fed into the chamber space and, in particular, into the processing space and also evacuated therefrom such that optimum processing conditions prevail. Since precisely with the present device (two substrates, whose precursor layers are disposed opposite each other) a specific processing space is already formed, the process gas can, for example, be fed via the spacing element (from a gas source), possibly even with no chamber space and/or processing space of a process box per se. The spacing element 70a of FIG. 7 thus has a gas feed element and/or a gas evacuation element 100a to feed and/or evacuate the process gas into and/or out of the processing space. With this type of spacing element 70a, a quasi-closed processing space is formed since the frame element substantially completely closes the space between the precursor layers. A fluid-permeable, in particular, a gas-permeable connection between the chamber space of the system and processing space or even only between the gas source and the processing space between the two substrates is thus guaranteed via the gas feed elements and/or a gas evacuation element. The gas feed element or gas evacuation element 100a can, for example, be configured as a gas diffusion: comb integrated into the spacing element with at least one connector element 101 to connect a gas feed line and/or gas evacuation line (not shown). The depicted frame 70a has, for example, four connector elements 101 (to connect gas lines), such that the gas can penetrate via the hollow frame element and corresponding openings (not shown) for the gas outlet (or inlet) into the processing space, i.e., between the substrates (partial or adaptable gas exchange between the furnace environment (environment in the chamber or in the tunnel or even environment in a process box or process hood per se) and precursor thin films or directly between the gas source and precursor thin films). In principle, the gas diffuser 100a can also be otherwise disposed on the chamber. It is important to enable a substantially homogeneous introduction of the process gas such that there is the most laminar gas flow possible over the substrate surface from, for example, one longitudinal edge to the other. The gas feed can be controlled at predefined inlets of the gas diffuser at any times during the tempering profile. Consumed quantities of the processing gas can thus be reloaded and/or no longer desired excess selenium vapor (or other components of the vapor) can be forced out of the reaction chamber at the right time.

FIG. 8 depicts another embodiment of a device 30d for positioning, here, a spacing element 70d. This comprises the frame element 71 with a cross-connection element 74 and a plurality of support elements 90 (in each case, one support element on the corners of the frame element and at the intersections of the frame element and the cross-connection element as well as a support element on the cross-connection element). The support elements 90 are here again configured as spherical elements. In this case, the spherical elements 90 are formed with a diameter greater than the height of the frame element 71. In this respect, the supported or abutting substrates (not shown) can be positioned only on the spherical elements 90 such that opening areas 62, 63, 64, 65 on the multilayer body arrangement (indicated here) remain for the gas exchange between the frame element 71 and the substrates. Also in this manner, a quasi-open processing space, i.e., a quasi-open sandwich arrangement, can be formed. For a better general view, only two of the spherical elements are provided with the reference character 90.

In the following, additional different embodiments of the device or arrangement (multilayer body arrangement) that depict some of the just described spacing elements are presented.

FIG. 9 depicts another embodiment of the device 30f for positioning or a multilayer body arrangement 28b according to the invention in a cross-sectional view. The first spacing element 70a (cf., for example, FIG. 3 or 7) additionally includes here a device 100a to feed and to evacuate process gas, since the frame 71 itself closes the processing space. A second spacing element 80a is further provided. The second spacing element 80a is provided here to accommodate the bottom multilayer body 40 and can be or is disposed at least partially under the bottom multilayer body 40. Furthermore, it is configured to accommodate the first spacing element 70a such that the second spacing element 80a, the bottom multilayer body 40, the first spacing element 70a, and the top multilayer body 50 can be disposed or, here, are disposed sandwich-like as a multilayer body arrangement 28b. The two spacing elements 70a, 80a have support regions 77, 82, above which the substrates 40, 50 can rest or abut. The second spacing element 80a can itself be configured as a frame element or, for example, even provided as two frame strip elements. The embodiments of the spacing elements depicted by FIG. 2 through 8 can likewise be provided for the second spacing element. As is discernible from the figures, the second, i.e., the bottom, spacing element 80a can also be configured such that it accommodates the bottom substrate 40 with the bottom support region 82, and the top substrate 50 in a top support region. Optionally, the bottom substrate would then have to be pushed in laterally on the bottom support region. Positioning with the second spacing element alone is thus also possible.

In the exemplary embodiment depicted in FIG. 9, the first spacing element 70a is set on the second spacing element 80a such that ultimately the sandwich-like arrangement is formed with the substrates 40, 50. The gas feed and/or evacuation elements can be provided on only one or on both spacing elements. The arrow G indicates the direction of the gas flow.

FIG. 10 depicts substantially the embodiment of the device or arrangement already described with FIG. 9. However, the spacing elements (frame elements) are formed with the cross-connection elements and, in addition, with point support elements that are provided here only on the cross-connection elements. In other words, a device 30g for positioning or a multilayer body arrangement 28c is depicted. The first spacing element 70b (frame element 71 with a cross-connection element 74) is, for example, that of FIG. 4, but with a device 100a to feed and/or to evacuate process gas. A second spacing element 80b corresponds substantially to that of FIG. 9, but with a further device 100b feed and/or to evacuate process gas. The spacing element 70b has, for example, the cross-connection element 74; the spacing element 80b, a cross-connection element 81. A support element 90 is, in each case, disposed centrally on the cross-connection elements. The substrates thus rest, in any case, on the supporting surfaces or support regions 77 or 82 and the respective support elements 90. Here again, the arrow G indicates the direction of the gas flow.

FIG. 11 depicts the device 30*a* or arrangement 28*a* according to the invention, as described, for example, with FIG. 2. This representation is schematic as well, since the possibility of gas exchanges with the environment is not explicitly shown (exchange, for example, between processing space between the substrates and the processing space of the box as well as between the box and chamber space or even only between a gas source and the processing space between the substrates). This figure is intended to depict the arrangement of the arrangement 28*a* or device 30*a* according to the invention in a device 20 for forming a reduced chamber space, here, a process box. The device 20 can then be introduced together with the multilayer body arrangement 28*a* into the system 10 (cf. FIG. 14) for processing, such that the desired process can be performed. In principle, processing without any gas exchange (e.g., between the process chamber and the process box or between a gas source and the process chamber or process box or process hood) is conceivable. Fluid exchange, in particular, gas exchange between the levels of the processing system is possible in various ways. Thus, for example, the exchange of gas can occur between a (e.g., external) gas source, the process chamber (or the process tunnel), and, optionally, the process box or hood. The gas exchange can also occur between an external gas source and an optionally present process box or hood in the absence of a process chamber, i.e., the process box is connected directly to the gas source. It is also possible to ensure the gas exchange only between the process box formed by the substrates and the gas source. The two substrates 40, 50 are positioned in the process box 20 with the spacing element 70*a* disposed between them. The process box 20 comprises a floor element 23, a cover element 22, and side wall elements 24, and thus surrounds the arrangement. Thus, in addition to the chamber space 12 of the process chamber (not shown) a processing space 21 per se is provided and the processing proceeds in a defined space. This facilitates the feeding of a defined quantity of process gas. The bottom substrate 40 rests on the floor element 23 of the process box 20, such that it is possible to do without a second spacing element (a bottom spacing element). Appropriate gas feed and/or evacuation elements (not shown, but as, for example, described above) can now be installed as desired on this arrangement.

FIG. 12 depicts the device 30*e* of FIG. 6 or an arrangement 28*d* of the two multilayer bodies 40, 50 with the spacing element 70*e* disposed between them in the chamber space 12 of a process chamber 11 or in a tunnel of a system. Here, no process box per se is provided; instead, a processing space 21' is formed by the arrangement itself. In other words, the substrates 40, 50 and also the device for positioning, here, the spacing element 70*e*, together form the process box such that the space provided between the precursor layers or the surfaces to be processed is substantially configured as the processing space 21'. The spacing element 70*e* corresponds to the two frame strip elements opposite each other described in FIG. 6 such that on the arrangement 28*d* on the transverse sides 68, 69, an opening area 60, 61 is, in each case, formed. The gas exchange with the chamber space or tunnel space takes place via these opening areas 60, 61. Thus, in principle, a quasi-open processing space 21' is formed with a quasi-open spacing element 70*e*. The process direction is provided as indicated by the arrow P, i.e., the process box with the load is transported in the direction indicated by the arrow into the overall system. Customarily, the airlocks 13, 14 are provided for this on the process chamber 11 such that an appropriate process gas pressure can be established in the chamber space 12. The short arrows G pointing in the opposite direction indicate how the process gas is guided through the processing space (between the two substrates). With the quasi-open spacing element, it is possible to do without gas feed elements or gas evacuation elements per se. The gas is introduced from at least one gas source, for example, from the external gas source already mentioned above, to fill the chamber space 12 and processing space 21'. Here, the arrangement 28*d* is depicted, purely schematically, freely floating. In practice, explicit elements for its positioning, such as a second spacing element, for instance, must be provided, which itself rests on the floor region of the chamber or the tunnel or the arrangement rests on the chamber floor 16 or on a carrier.

FIG. 13 depicts an arrangement 28*e* and the device 30*d* (FIG. 8), which are likewise disposed in a chamber space or tunnel space 12, as described with FIG. 12. The spacing element 70*d* is that described with FIG. 8. Since the substrates 40, 50 are resting only on the spherical elements or abut against them, the arrangement is a quasi-open one; the process gas can, as indicated with the short arrows, be exchanged between the chamber environment or the tunnel environment via the opening areas 62, 63 on the transverse sides 68, 69 or via the opening areas 64, 65 on the longitudinal sides 66, 67 of the arrangement 28*d*.

FIG. 14 depicts, finally, the system 10 already described above, into which the arrangements 28*a*, 28*b*, 28*c*, 28*d*, and/or 28*e* with the devices 30*a*, 30*b*, 30*c*, 30*d*, 30*e*, 30*f*, and/or 30*g* for positioning (not shown here) can be introduced for processing with or without a device per se for forming a reduced chamber space. The transport of the arrangement or of the device (with or without a device for forming a reduced chamber space) into and out of the system occurs, for example, via a transport device (not shown), that operates with or without a support (i.e., for example, a carrier) for the substrates or also manually. The assembly of the multilayer body arrangement in the system is also possible. The multilayer body arrangement could likewise be assembled on a carrier and introduced in that manner into the process chamber or into a process tunnel of the processing system (e.g., by means of a transport device) (in which, for example, a process hood that can be lowered onto the multilayer body arrangement is situated). Even without a device per se for forming a reduced chamber space, the processing can be performed.

With the device presented for positioning objects with a multilayer body arrangement formed therewith, with a multilayer body arrangement, that is assembled without a device for positioning, a system for processing the multilayer body arrangement, and with the corresponding method for forming the multilayer body arrangement, multilayer bodies, e.g. substrates, can be processed in a simple manner with high throughput (for example, for production of chalcopyrite semiconductors).

In the following, further aspects of the invention are described:

The invention presents a device for positioning at least two objects, in particular, at least two multilayer bodies each having at least one surface to be processed, wherein the device to accommodate the at least two objects, in particular, multilayer bodies, is configured such that the surfaces to be processed are opposite each other and the objects, in particular, multilayer bodies, thus form a processing space between the surfaces, in which the processing substantially occurs such that the at least two objects are processable, in particular selenizable, as a multilayer body arrangement in a processing system. In one embodiment, the device is configured such that it can be disposed or is disposed in a processing chamber or a process tunnel of the processing system with a chamber space and/or in a device for forming a reduced chamber space, preferably in a process box with a floor element, a cover element, and, preferably, with side wall elements or inside a process hood, which is configured, in particular, for stationary retention in the processing system, and/or on or against a carrying element for transporting the multilayer body arrangement by means of a transport device into the processing system and out of it. In one embodiment, the device is configured such that the multilayer bodies are disposed sandwich-like on top of each other while in use and thus form a bottom multilayer body and a top multilayer body of the multilayer body arrangement. In one embodiment, the device is configured and/or can be disposed in a chamber space of the process chamber of the processing system such that the two multilayer bodies can be disposed such that they at least partially form the device for forming a reduced chamber space, preferably a process box. In one embodiment, the device has at least a first spacing element that is configured to accommodate the top multilayer body and/or the bottom multilayer body, wherein the spacing element can be disposed at least partially between the two multilayer bodies such that these can be or are disposed with space between them and thus form the multilayer body arrangement. In one embodiment, the device has at least a second spacing element that is configured to accommodate the top multilayer body and/or the bottom multilayer body and to accommodate the first spacing element such that the second spacing element, the bottom multilayer body, the first spacing element, and the top multilayer body can be or are disposed sandwich-like and thus form the multilayer body arrangement, wherein, preferably, the second spacing element while in use can be or is disposed at least partially under the bottom multilayer body. In one embodiment, in the device, the first spacing element and/or the second spacing element have, in each case, at least one frame element and/or one frame strip element such that the multilayer bodies can preferably rest on their edge regions at least partially on the frame element and/or the frame strip element or can be abutted against the frame element and/or the frame strip element. In one embodiment, in the device, the two multilayer bodies and the first spacing element or the two multilayer bodies and the first spacing element and the second spacing element are disposed relative to each other such that they form a substantially closed processing space. In one embodiment, in the device, the first spacing element and/or the second spacing element have two frame strip elements that are, while in use, opposite each other in a plane of extension of the multilayer bodies, such that the multilayer bodies preferably on their edge regions, preferably on their longitudinal sides, can rest at least partially on the frame strip elements or can abut against the frame strip elements such that, on the multilayer body arrangement, preferably on the transverse sides in each case, at least one opening area is formed to feed and/or evacuate the process gas into and/or out of the processing space. In one embodiment, in the device, the first spacing element and/or the second spacing element have a gas feed element and/or gas evacuation element to feed and/or evacuate the process gas into and/or out of the processing space, wherein, preferably, the gas feed element and/or gas evacuation element is configured as a gas diffuser comb integrated into the first spacing element and/or the second spacing element with at least one connector element to connect a gas feed line and/or gas evacuation line. In one embodiment, in the device, the first spacing element and/or the second spacing element have, in each case, at least one cross-connection element to connect regions of the respective frame element opposite each other in the plane of extension of the multilayer bodies or of frame strip elements opposite each other while in use such that the multilayer body(bodies) can be additionally supported to prevent bending. In one embodiment, in the device, the cross-connection element has at least one support element, preferably a point support element, particularly preferably a spherical element such that the multilayer bodies can abut against or rest on the cross-connection element via the support element, wherein the support element is configured such that it has the same height as the respective at least one frame element or frame strip element. In one embodiment, in the device, the at least one frame element or frame strip element has at least two support elements such that the multilayer bodies can rest on or abut against the support elements such that on the transverse sides and/or longitudinal sides of the multilayer body arrangement, in each case, at least one opening area is formed to feed and/or evacuate the process gas into and/or out of the processing space. According to the invention, a multilayer body arrangement comprises at least two multilayer bodies each having one surface to be processed and at least one device as described above for positioning the at least two multilayer bodies. According to the invention, a multilayer body arrangement comprises at least two multilayer bodies each having one surface to be processed, wherein the at least two multilayer bodies are disposed such that the respective surfaces to be processed are opposite each other and the multilayer bodies thus form a processing space disposed between the surfaces in which, substantially, the processing occurs. According to the invention, a system for processing, in particular for selenizing, at least two objects, in particular at least two multilayer bodies each having at least one surface to be processed comprises at least one process chamber with a chamber space and a device as described above for positioning the at least two objects. According to the invention, a method for positioning at least two objects, in particular at least two multilayer bodies having, any case, one surface to be processed, by means of a device for positioning the at least two objects, in particular multilayer bodies, which is configured to accommodate the at least two objects, in particular the multilayer bodies, comprises the following steps: Arranging the device on a location provided therefor; Arranging the two objects, in particular the two multilayer bodies, on the device such that the respective surfaces to be processed are opposite each other and the objects, in particular multilayer bodies, thus form a processing space disposed between them, in which, substantially, the processing occurs, such that the at least two objects can be processed, in particular can be selenized, as a multilayer body arrangement in a processing system. According to the invention, a method for positioning at least two objects, in particular at least two multilayer bodies, each having at least one surface to be processed, comprises the following steps: Arranging the two objects, in particular the two multilayer bodies such that the respective surfaces to be processed are opposite each other and the objects, in particular multilayer bodies, thus form a processing space disposed between the two surfaces, in which, substantially, the processing occurs, such that the at least two objects can be processed, in particular can be selenized, as a multilayer body arrangement in a processing system.

List of Reference Characters
10 System for processing
11 Process chamber, process tunnel
12 Chamber space
13 Entry door
14 Exit door 15 Chamber cover
16 Chamber floor
17 Chamber wall or walls
18 Source(s) for electromagnetic radiation
20 Device for forming a reduced chamber space, process box
21, 21' Processing space
22 Cover element
23 Floor element
24 Side wall element(s)
28a Arrangement, multilayer body arrangement
28b Arrangement, multilayer body arrangement
28c Arrangement, multilayer body arrangement
28d Arrangement, multilayer body arrangement
28e Arrangement, multilayer body arrangement
30a Device for positioning
30b Device for positioning
30c Device for positioning
30d Device for positioning
30e Device for positioning
30f Device for positioning
30g Device for positioning
40 Bottom multilayer body, substrate
41 Edge region(s)
44 Surface to be processed
45 (Precursor) coating
50 Top multilayer body, substrate
51 Edge region(s)
54 Surface to be processed
55 (Precursor) coating
60 Opening region arrangement
61 Opening region arrangement
62 Opening region arrangement
63 Opening region arrangement
64 Opening region arrangement
65 Opening region arrangement
66 Longitudinal side arrangement
67 Longitudinal side arrangement
68 Transverse side arrangement
69 Transverse side arrangement
70a First spacing element
70b First spacing element
70c First spacing element
70d First spacing element
70e First spacing element
71 Frame element
72 Frame strip element
73 Frame strip element
74 Cross-connection element
75 Cross-connection element
76 Cross-connection element
77 Support region
80a Second spacing element
80b Second spacing element
81 Cross-connection element
82 Support region
90 Support element(s)
100a Device for feeding and/or evacuation of process gas, gas feed element(s) and/or gas evacuation element(s)
100b Device for feeding and/or evacuation of process gas, gas feed element(s) and/or gas evacuation element(s)
101 Connector element(s)
G Gas flow direction
P Process direction
B Direction of movement entry door, exit door

The invention claimed is:

1. A multilayer body arrangement, comprising:
   at least two multilayer bodies each comprising surface to be processed; and
   a device, which positions the multilayer bodies,
   wherein the device is configured such that the surfaces of the multilayer bodies to be processed are opposite to each other and form a quasi-closed processing space disposed between the surfaces, in which the processing occurs,
   wherein the quasi-closed processing space comprises an opening between edges of the at least two multilayer bodies and wherein the at least two multilayer bodies are disposed with a distance between them that provides a pressure balance resistance between the quasi-closed processing space and external surroundings thereof, such that a loss of mass of gas from the quasi-closed processing space is more than 0% and less than 50%.

2. The arrangement of claim 1, which is disposed
   in a processing chamber, or
   in a processing tunnel of a processing system comprising a chamber space, and/or
   in a second device, which forms a reduced chamber space that is formed for stationary retention in a processing system, and/or
   on a carrying element, which transports with a transport device into a processing system and out of the processing system.

3. The arrangement of claim 2, wherein the device is formed so as to dispose the two multilayer bodies such that they form, at least partially, the second device, which forms the reduced chamber space.

4. The arrangement of claim 1, wherein the device is configured such that the multilayer bodies are sandwiched on top of each other while in use, thereby forming a bottom multilayer body and a top multilayer body.

5. The arrangement of claim 4, wherein the device comprises a first spacing element, which accommodates the top multilayer body and/or the bottom multilayer body,
   wherein the spacing element is disposed at least partially between the two multilayer bodies such that the two multilayer bodies are disposed with space between them.

6. The arrangement of claim 5, wherein the device comprises a second spacing element, which accommodates the top multilayer body and/or the bottom multilayer body, and which accommodates the first spacing element such that the second spacing element, the bottom multilayer body, the first spacing element, and the top multilayer body are form a sandwich.

7. The arrangement of claim 6, wherein the first spacing element and/or the second spacing element comprises, in each case, a frame element and/or a frame strip element, such that the multilayer bodies, on their edge regions at least partially abut or rest on the frame element and/or the frame strip element.

8. The arrangement of claim 6, wherein the first spacing element and/or the second spacing element comprise two frame strip elements, that are opposite each other while in use in a plane of extension of the multilayer bodies, such that the multilayer bodies on their an edge regions, at least partially abut or rest on the two frame strip elements, such that on the multilayer body arrangement an opening area is formed to feed and/or to evacuate a process gas into and/or out of the processing space.

9. The arrangement of claim 6, wherein the first spacing element and/or the second spacing element comprises a gas feed element and/or gas evacuation element to feed and/or to evacuate a process gas into and/or out of the quasi-closed processing space, wherein the gas feed element and/or gas evacuation element is configured as a gas diffuser comb integrated into the first spacing element and/or the second spacing element with a connector element, which connects a gas feed line and/or a gas evacuation line.

10. The arrangement of claim 7, wherein the first spacing element and/or the second spacing element each comprise a cross-connection element, which connects regions of the respective frame element opposite each other in a plane of extension of the multilayer bodies or of the frame strip elements opposite each other while in use, such that the multilayer bodies are supported to prevent bending.

11. The arrangement of claim 10, wherein the cross-connection element comprises a support element, such that the multilayer bodies rest on or abut the cross-connection element via the support element,
wherein the support element has the same height as the frame element or the frame strip elements.

12. The arrangement of claim 11, wherein the frame element or the frame strip elements comprise at least two support elements such that the multilayer bodies rest on or abut the support elements, such that on transverse sides and/or longitudinal sides of the multilayer body arrangement an opening region is formed to feed and/or to evacuate a process gas into and/or out of the processing space.

13. The arrangement of claim 1, wherein the loss of mass of gas from the quasi-closed processing space is more than 0% and less than 10%.

14. The arrangement of claim 1, wherein the loss of mass of gas from the quasi-closed processing space is more than 0% and less than 1%.

15. The arrangement of claim 1, wherein the loss of mass of gas from the quasi-closed processing space is more than 0% and less than 0.1%.

16. A system, comprising:
a process chamber comprising a chamber space; and
the multilayer body arrangement of claim 1 disposed in the process chamber.

17. A method for processing at least two multilayer bodies, the process comprising:
processing at least two multilayer bodies, each comprising a surface to be processed,
wherein the two multilayer bodies are disposed with the surfaces to be processed opposite to each other, such that a quasi-closed processing space is disposed between the surfaces, in which the processing occurs,
wherein the quasi-closed processing space comprises an opening between edges of the at least two multilayer bodies and wherein the at least two multilayer bodies are disposed with a distance between them that provides a pressure balance resistance between the quasi-closed processing space and external surroundings thereof, such that a loss of mass of gas from the quasi-closed processing space is more than 0% and less than 50%.

18. The method of claim 17,
wherein each multilayer body is implemented in the form of a glass pane and is coated with at least the elements Cu, In or Cu, In, Ga or Cu, In, Ga, selenium for the selenization and/or sulfurization, and
the processing comprises thermally processing the multilayer body, to form a chalcopyrite thin-film semiconductor.

19. The method of claim 17, wherein the loss of mass of gas from the quasi-closed processing space is more than 0% and less than 10%.

20. The method of claim 17, wherein the loss of mass of gas from the quasi-closed processing space is more than 0% and less than 1%.

21. The method of claim 17, wherein the loss of mass of gas from the quasi-closed processing space is more than 0% and less than 0.1%.

* * * * *